(12) United States Patent
Oka et al.

(10) Patent No.: US 6,268,033 B1
(45) Date of Patent: *Jul. 31, 2001

(54) HEAT-RESISTING ADHESIVE COMPOSITION AND ADHESIVE TAPES FOR ELECTRONIC PARTS

(75) Inventors: Osamu Oka; Takeshi Sato, both of Shizuoka (JP)

(73) Assignee: Tomoegawa Paper Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/158,527

(22) Filed: Sep. 22, 1998

(30) Foreign Application Priority Data

Sep. 26, 1997 (JP) .................................................. 9-261205

(51) Int. Cl.[7] .................................................. C09J 7/02
(52) U.S. Cl. ..................... 428/40.1; 428/41.3; 428/41.7; 428/41.8; 428/355 N; 428/473.5; 525/432; 525/437
(58) Field of Search .................... 525/432, 437; 428/40.1, 41.3, 41.7, 41.8, 355 N, 473.5

(56) References Cited

U.S. PATENT DOCUMENTS

| | | | | |
|---|---|---|---|---|
| 5,300,627 | * | 4/1994 | Kunimune et al. | 528/353 |
| 5,457,149 | * | 10/1995 | Hall et al. | 25/523 |
| 5,723,571 | * | 3/1998 | Oka et al. | 528/353 |
| 5,866,250 | * | 2/1999 | Oka et al. | 428/355 N |
| 5,959,068 | * | 9/1999 | Oka et al. | 528/310 |
| 6,045,886 | * | 4/2000 | Oka et al. | 428/41.5 |

FOREIGN PATENT DOCUMENTS

2-180951   7/1990 (JP) .

* cited by examiner

*Primary Examiner*—Nasser Ahmad
(74) *Attorney, Agent, or Firm*—McDermott, Will & Emery (57) ABSTRACT

A heat resisting adhesive composition for electronic parts and adhesive tapes of the present invention comprises a resin mixture of (A) 100 parts by weight of a polyimide comprising 100–30% by mol of at least one of the repeating units represented by the following formulas (1a) and (1b) and 0–70% by mol of at least one of the repeating unit represented by the following formulas (2a) and (2b) and (B) 5–150 parts by weight of a polyimide consisting of the repeating unit represented by the following formula (2a):

(1a)

(1b)

wherein Ar represents a specified divalent group containing aromatic rings:

(2a)

(2b)

wherein R is $C_1$–$C_{10}$ alkylene group or —$CH_2OC_6H_4$—, the methylene group of which attaches to Si, and n is integer of 1–20.

12 Claims, 2 Drawing Sheets

HEAT-RESISTING ADHESIVE COMPOSITION AND ADHESIVE TAPES FOR ELECTRONIC PARTS

BACKGROUND OF THE INVENTION

1) Field of the Invention

The present invention relates to a heat-resisting adhesive composition for electronic parts to be used for TAB tapes, adhesive tapes for fixing the leadframe or for adhering between parts around leadframes making up a semiconductor device, e.g., leadpins, semiconductor chip mounted substrates, heat spreader, semiconductor chips themselves, and to an adhesive tape for electronic parts using the above adhesive composition.

2) Description of the Related Art

Conventionally, adhesive tapes for fixing a leadframe, TAB tapes, etc., are used as adhesive tapes for use in the interior of resin-molded type semiconductor devices. For example, the adhesive tapes for fixing the leadframe have been used to fix lead pins of the leadframe in order to enhance the efficiency for producing the leadframe itself and the whole semiconductor assembly stages. In general, a leadframe manufacturer tapes a leadframe, and brings it to a semiconductor manufacturer, at which a semiconductor chip is mounted thereon followed by molding the leadframe with a resin. For this reason, it has been required for the adhesive tapes for fixing the leadframe not only to possess general reliability in a level required for semiconductor and enough processability at the time of taping, but also to possess sufficient adhesive strength at room temperature immediately after taping and heat resistance enough for withstanding thermal process at the stages of assembling semiconductor devices.

Conventionally, the adhesive tapes for use in such an application include adhesive tapes applying on a support film of a polyimide film, etc., an adhesive comprising polyacrylonitrile, polyacrylate or a synthetic rubber resin such as acrylonitrile-butadiene copolymer solely, or modified with any other resin or blended with any other resin to come into a B-stage. Both-sided adhesive tapes using thermoplastic polyimide resin having high reliability and high heat resistance have been utilized recently.

Figure 1:
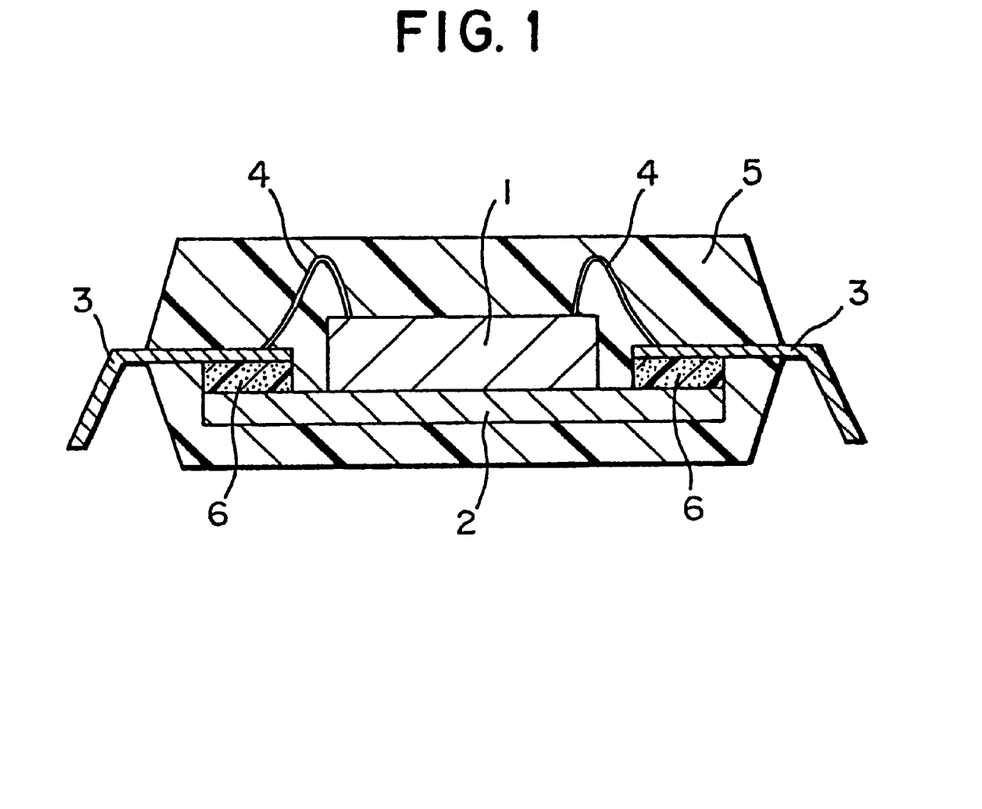
FIG. 1 is a cross-sectional view of an embodiment of a resin-molded type semiconductor device using the adhesive tape of the present invention or the prior conventional adhesive tape.
Figure 2:
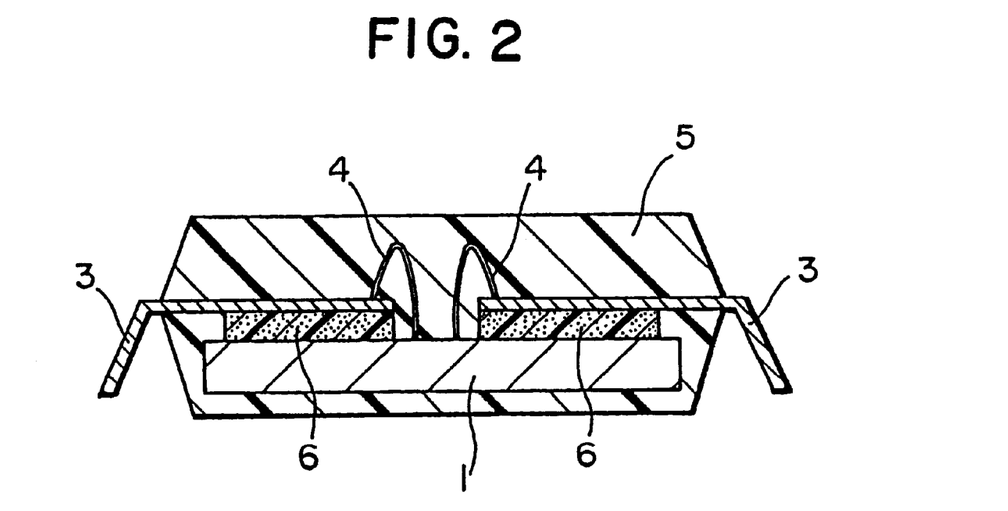
FIG. 2 is a cross-sectional view of an embodiment of a resin-molded type semiconductor device using the adhesive tape of the present invention or the prior conventional adhesive tape.
Figure 3:
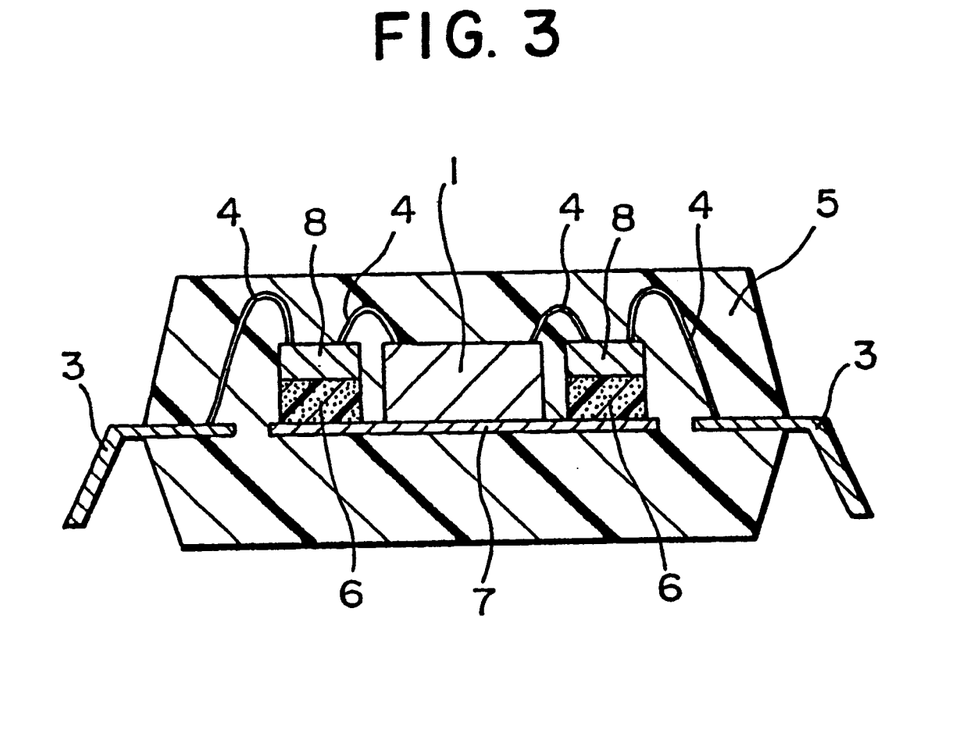
FIG. 3 is a cross-sectional view of an embodiment of a resin-molded type semiconductor device using the adhesive tape of the present invention or the prior conventional adhesive tape.

In recent years, resin-molded type semiconductor devices (semiconductor packages) as shown in FIGS. 1–3 have been developed and produced. In FIG. 1, the device has a construction in which lead pins 3 and a metal plane 2 are connected by means of an adhesive layer 6, a semiconductor chip 1 is mounted on the metal plane 2, and they are molded with a resin 5 together with bonding wires 4 between the semiconductor chip 1 and the lead pins 3. In FIG. 2, the device has a construction in which the lead pins 3 and the semiconductor chip 1 are connected by means of an adhesive layer 6 and they are molded with a resin 5. In FIG. 3, the device has a construction in which the semiconductor chip 1 is mounted on a die pad 7, electrodes 8 and the die pad are connected by means of the adhesive layers 6, the semiconductor chip 1 is electrically connected to the electrodes 8 and the electrodes 8 are electrically connected to the lead pins 3 by means of bonding wires 4, and they are molded with a resin 5. In these cases, in general, single-layer adhesive tapes or both-sided adhesive tapes are used for the adhesive layer 6. Further, the adhesive layer 6 may be produced directly on the leadframe or the semiconductor chip by printing or applying a liquid adhesive by means of a dispense.

In the adhesive layers in the resin-molded type semiconductor devices shown in FIGS. 1–3, the use of an adhesive tape to which a conventional adhesive is applied has the problems that the generated gas stains the lead to cause deterioration of the adhesive strength or causes generation of package crack, because of insufficient heat resistance. It is therefore required to develop adhesives for electronic parts having sufficient heat resistance and reliability and adhesive tapes for electronic parts using them.

In order to satisfy the above described requirements, various kinds of adhesive tapes using thermoplastic polyimide resin having excellent electric reliability, such as those of having 3-layered structure or single-layer structure. However, the thermoplastic polyimide resins have various drawbacks. Many of them have a high glass transition temperature (Tg) and require an adhesion temperature of 300° C.–400° C. or higher, by which they causes oxidation and strains of the leadframe or damaging the semiconductor chips.

On the other hand, when thermoplastic resins having a low Tg are used for allowing adhesion at a low temperature, there causes problems of reducing reliability of the package, because the resins flow in the assembling stages using heat and pressure, such as wire bonding stage, molding stage, IR reflowing stage etc. and, consequently, sufficient adhesion is impossible to carry out.

The present invention has been made for the purpose of solving such problems in the prior arts. Namely, an object of the present invention is to provide a heat-resisting adhesive composition for electronic parts capable of adhesion at a relatively low temperature and having sufficient reliability without causing flowing of the resin in stages using heat and pressure, and to provide an adhesive tape for electronic parts using the same.

SUMMARY OF THE INVENTION

The heat resisting adhesive composition for electronic parts of the present invention is characterized by comprising a resin mixture of (A) 100 parts by weight of a polyimide comprising 100–30% by mol of at least one of the repeating units represented by the following formulas (1a) and (1b) and 0–70% by mol of at least one of the repeating unit represented by the following formulas (2a) and (2b) and (B) 5–150 parts by weight of a polyimide consisting of the repeating unit represented by the following formula (2a):

wherein Ar represents a divalent group selected from the following formulas containing aromatic rings:

wherein $R_1$, $R_2$, $R_3$ and $R_4$ which may be identical or different represent each a hydrogen atom, an alkyl group having 1–4 carbon atoms or an alkoxy group having 1–4 carbon atoms, provided that $R_1$, $R_2$, $R_3$ and $R_4$ are not hydrogen atoms at the same time.

(2a)

(2b)

wherein R is an alkylene group having 1 to 10 carbon atoms or —$CH_2OC_6H_4$—, the methylene group of which attaches to Si, and n means an integer of 1 to 20.

The heat-resisting adhesive composition for electronic parts of the present invention may contains a silane coupling agent in an amount of 15 parts by weight or less based on 100 parts by weight of said resin mixture and may contains a filler in an amount of 0.1–50 parts by weight based on 100 parts by weight of said resin mixture. In the present invention, organic solvents may be used for making the heat-resisting adhesive composition in a liquid state.

The first adhesive tape for electronic parts of the present invention is characterized in that an adhesive layer consisting of the above mentioned heat-resisting adhesive composition is provided on a side or both sides of a heat-resisting film. In the first adhesive tape, a releasing sheet may be provided as a protective layer on the adhesive layer.

The second adhesive tape for electronic parts of the present invention is composed of a single-layer adhesive film having a thickness of 5–250 μm consisting of the above mentioned heat-resisting adhesive composition. In the second adhesive tape, a releasing sheet may be provided as a protective layer on a side or both sides of the single-layer adhesive film.

DETAILED DESCRIPTION OF PREFERRED EMBODIMENTS

The embodiments of the present invention will now be described in detail.

The first polyimide (A) which is one of the essential components of the heat-resisting adhesive composition of the present invention comprises 100–30% by mol of at least one of the repeating units represented by the above-mentioned formulas (1a) and (1b) and 0–70% by mol of at least one of the repeating unit represented by the above-mentioned formulas (2a) and (2b).

In the above described polyimide (A) used in the present invention, the greater the proportion of the repeating units represented by the formula (1a) or (1b) is, the higher the glass transition temperature becomes, while the greater the proportion of the repeating units represented by the formulas (2a) or (2b) is, the lower the glass transition temperature becomes. Accordingly, it is possible to control the glass transition temperature of the polyimide (A) by varying the proportion of the repeating units represented by the above-mentioned formulas, by which it becomes possible to control the temperature capable of bonding with pressure. The polyimide (A) is preferred to contain 70% by mol or more of the repeating units represented by the formulas (1a), (1b), (2a) and (2b). In the first polyimide, repeating units of the other acid anhydride may be present if the amount thereof is less than 30% by mol. As the polyimide (A) used in the present invention, though one species of the above mentioned polyimides may be used alone, two or more species selected from the above described polyimides may be suitably mixed in order to control the glass transition temperature (Tg).

The polyimide (A) to be used in the present invention can be produced according to conventional processes for producing polyimides. In detail, the polyimide (A) can be produced from tetracarboxylic dianhydrides corresponding to the desired repeating units and diamines or diisocyanates corresponding to the desired repeating units.

In more detail, the polyimide (A) can be produced by reacting 3,3',4,4'-diphenylsulfone tetracarboxylic dianhydride and/or ethylene glycol bistrimellitate dianhydride as tetracarboxylic dianhydrides with a compound represented by the following formula (3) and/or a siloxane compound represented by the following formula (4). In the production, if necessary, less than 30% by mol of other acid anhydrides may be used together with the above-mentioned tetracarboxylic dianhydrides.

Y—Ar—Y        (3)

wherein Ar is the same meaning as described above and Y is an amino group or an isocyanate group.

(4)

wherein R is an alkylene group having 1 to 10 carbon atoms or —CH$_2$OC$_6$H$_4$—, the methylene group of which attaches to Si, Y is an amino group or an isocyanate group, and n means an integer of 1 to 20.

Examples of other acid anhydrides which are optionally used in an amount of less than 30% by mol together with 3,3',4,4'-diphenylsulfone tetracarboxylic dianhydride and ethylene glycol bistrimellitate dianhydride in the above-mentioned first polyimide of the present invention include trimellitic anhydride, pyromellitic dianhydride, 3,3',4,4'-benzophenonetetracarboxylic dianhydride, 3,3',4,4'-biphenyltetracarboxylic dianhydride, 2,3',3,4'-biphenyltetracarboxylic dianhydride, bis(3,4-dicarboxyphenyl)ether dianhydride, 4,4'-bis(3,4-dicarboxyphenoxy)diphenyl sulfone dianhydride, 2,2-bis[4-(3,4-dicarboxyphenoxy)phenyl]propane dianhydride, etc.

The compound represented by the above-mentioned formula (3) has a divalent group Ar selected from the above described structures having aromatic rings. Typical examples of the compound wherein the functional group Y is an amino group include the following diamines: 3,3'-diaminobiphenyl, 3,4'-diaminobiphenyl, 4,4'-diaminobiphenyl, 3,3'-oxydianiline, 3,4'-oxydianiline, 4,4'-oxydianiline, 3,3'-diaminodiphenylmethane, 3,4'-diaminodiphenylmethane, 4,4'-diaminodiphenylmethane, 3,3'-diamino-2,2',4,4'-tetramethyldiphenylmethane, 3,3'-diamino-2,2',4,4'-tetraethyldiphenylmethane, 3,3'-diamino-2,2',4,4'-tetrapropyldiphenylmethane, 3,3'-diamino-2,2',4,4'-tetraisopropyldiphenylmethane, 3,3'-diamino-2,2',4,4'-tetrabutyldiphenylmethane, 3,4'-diamino-2,3',4,5'-tetramethyldiphenylmethane, 3,4'-diamino-2,3',4,5'-tetraethyldiphenylmethane, 3,4'-diamino-2,3',4,5'-tetrapropyldiphenylmethane, 3,4'-diamino-2,3',4,5'-tetraisopropyldiphenylmethane, 3,4'-diamino-2,3',4,5'-tetrabutyldiphenylmethane, 4,4'-diamino-3,3',5,5'-tetramethyldiphenylmethane, 4,4'-diamino-3,3',5,5'-tetraethyldiphenylmethane, 4,4'-diamino-3,3',5,5'-tetrapropyldiphenylmethane, 4,4'-diamino-3,3',5,5'-tetraisopropyldiphenylmethane, 4,4'-diamino-3,3',5,5'-tetrabutyldiphenylmethane, 4,4'-diamino-3,3'-diethyl-5,5'-dimethyldiphenylmethane, 4,4'-diamino-3,3'-dimethyldiphenylmethane, 4,4'-diamino-3,3'-diethyldiphenylmethane, 4,4'-diamino-3,3',5,5'-tetramethoxydiphenylmethane, 4,4'-diamino-3,3',5,5'-tetraethoxydiphenylmethane, 4,4'-diamino-3,3',5,5'-tetrapropoxydiphenylmethane, 4,4'-diamino-3,3',5,5'-tetraisopropoxydiphenylmethane, 4,4'-diamino-3,3',5,5'-tetrabutoxydiphenylmethane, 4,4'-diamino-3,3'-dimethoxydiphenylmethane, 4,4'-diamino-3,3'-diethoxydiphenylmethane, 3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone, 2,2-bis(3-aminophenyl)propane, 2,2-bis(4-aminophenyl)propane, 2,2-bis(3-aminophenyl)hexafluoropropane, 2,2-bis(4-aminophenyl)hexafluroropropane, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 9,9-bis(3-aminophenyl)fluorene, 9,9-bis(4-aminophenyl)fluorene, 1,3-bis[(3-aminophenyl)-1-methylethyl]benzene, 1,3-bis[1-(4-aminophenyl)-1-methylethyl]benzene, 1,4-bis[1-(3-aminophenyl)-1-methylethyl]benzene, 1,4-bis[1-(4-aminophenyl)-1-methylethyl]benzene, 3,3'-bis(3-aminophenoxy)biphenyl, 3,3'-bis(4-aminophenoxy)biphenyl, 3,4'-bis(3-aminophenoxy)biphenyl, 3,4'-bis(4-aminophenoxy) biphenyl, 4,4'-bis(3-aminophenoxy)biphenyl, 4,4'-bis(4-aminophenoxy)biphenyl, 3,3'-bis(3-aminophenoxy) diphenyl ether, 3,3'-bis(4-aminophenoxy)diphenyl ether, 3,4'-bis(3-aminophenoxy)diphenyl ether, 3,4'-bis(4-aminophenoxy)diphenyl ether, 4,4'-bis(3-aminophenoxy)diphenyl ether, 4,4'-bis(4-aminophenoxy)diphenyl ether, bis[4-(3-aminophenoxy)phenyl]sulfone, bis[4-(4-aminophenoxy)phenyl]sulfone, 2,2-bis[3-(3-aminophenoxy)phenyl]propane, 2,2-bis[3-(4-aminophenoxy)phenyl]propane, 2,2-bis[4-(3-aminophenoxy)phenyl]propane, 2,2-bis[4-(4-aminophenoxy)phenyl]propane, 2,2-bis[3-(3-aminophenoxy)phenyl]hexafluoropropane, 2,2-bis[3-(4-aminophenoxy)phenyl]hexafluoropropane, 2,2-bis[4-(3-aminophenoxy)phenyl]hexafluoropropane, 2,2-bis[4-(4-aminophenoxy)phenyl]hexafluoropropane, and the like.

Examples of diisocyanates which are the compounds represented by the formula (3) wherein the functional group Y is an isocyanate group include those exemplified in the above mentioned diamines in which "amino" is replaced by "isocyanate".

Typical examples of the siloxane compound represented by the formula (4) to be used as a raw material for production of the first polyimide wherein the functional group Y is an amino group include the following diamines: bis(3-aminopropyl)tetramethyldisiloxane, bis(10-aminodecamethylene)tetramethyldisiloxane, aminopropyl terminated dimethylsiloxane tetramer and octamer, bis(3-aminophenoxymethyl) tetramethyldisiloxane and the like. These siloxane compounds may be used as a mixture of two or more thereof.

Examples of diisocyanates which are the siloxane compounds represented by the formula (4) wherein the functional group Y is an isocyanate group include those exemplified in the above mentioned diamines in which "amino" is replaced by "isocyanate".

The diisocyanates wherein the functional group Y in the above mentioned formulas (3) and (4) is an isocyanate group can be easily produced by reacting the above exemplified corresponding diamines with phosgene.

The polyimide (A) used in the present invention can be produced as follows. In the case of using tetracarboxylic dianhyrides and diamines as the raw materials for the polyimide, it is possible to use the following processes: namely, a process for directly obtaining a polyimide by heating a tetracarboxylic dianhyrides and diamines in an organic solvent, optionally in the presence of a catalyst (in an amount of not more than 20 parts by weight of the reactants) such as tributylamine, triethylamine, or triphenyl phosphite to a temperature of not less than 100° C., and preferably not less than 180° C.; a process for obtaining a polyimide by reacting tetracarboxylic dianhyrides with diamines in an organic solvent at a temperature of not more than 100° C. to obtain a polyamic acid which is a precursor of the polyimide, optionally adding a dehydrating such as p-toluenesulfonic acid (in an amount of 1 to 5 times the mol of the tetracarboxylic dianhydride), and then heating the solution to cause an imidation; and a process in which the above-mentioned polyamic acid is caused to a ring-closure reaction at a relatively low temperature (in a range from room temperature to 100° C.) by adding dehydrating ring-closure agent such as an anhydride, e.g., acetic anhydride, propionic anhydride or benzoic anhydride, a carbodiimide compound, e.g., dicyclohexylcarbodiimide, and optionally a ring closing catalyst such as pyridine, isoquinoline, imidazole and triethylamine (as for the dehydrating ring closing agent and ring-closure catalyst, in an amount of 2 to 10 times the mol of the tetracarboxylic dianhydride).

Examples of the organic solvents used in the above mentioned reactions include aprotic polar solvents such as N-methyl-2-pyrrolidone, N,N-dimethylacetamide, N,N-dimethylformamide, dimethylsulfoxide, sulforane, hexamethylphosphoric acid triamide, and 1,3-dimethyl-2-imidazolidone, and phenol solvents such as phenol, cresol, xylenol, and p-chlorophenol. Optionally, solvents such as benzene, toluene, xylene, methyl ethyl ketone, acetone, tetrahydrofuran, dioxane, monoglyme, diglyme, methyl cellosolve, cellosolve acetate, methanol, ethanol, isopropanol, methylene chloride, chloroform, trichloroethylene, and nitrobenzene can be mixed with the above-mentioned solvents as a mixture.

In the case where tetracarboxylic dianhydrides and diisocyanates are used as the raw materials, the product can be produced according to the above-mentioned process for directly obtaining a polyimide. In this case, the reaction temperature is preferably not less than room temperature, and particularly not less than 60° C. The polyimide having a high polymerization degree can be produced by the reaction between equimolar amounts of the tetracarboxylic dianhydrides and the diamines or diisocyanates. If necessary, either of them is capable of using in an excess amount of less than 10% by mol.

Since the film formability depends upon molecular weight of the polyimide (A) used in the present invention, the molecular weight can be optimally decided according to desired film formability. In the present invention, polyimide having too low molecular weight is not preferred because film formability in some degree and good heat resisting property are required in the adhesive layer when the adhesive tape is used for electronic parts. In the present invention, the number average molecular weight of the polyimide (A) is generally in a range of from 4,000 to 400,000, and preferably from 8,000 to 200,000. If the number average molecular weight is higher than 400,000, processibility of the polyimide becomes poor when producing the adhesive tape because of increasing the viscosity of the fused resin, and the adhesive property deteriorates too.

The second polyimide (B) which is the other essential component of the present invention is siloxane type polyimide resin having the repeating unit represented by the above mentioned formula (2a), which can be produced by reacting 3,3',4,4'-diphenylsulfonetetracarboxylic dianhydride with diaminosiloxane represented by the above mentioned formula (4) by the same manner as in the above described first polyimide. In the polyimide (B), it is not preferred to use other acid anhydrides together with 3,3',4,4'-diphenylsulfonetetracarboxylic dianhydride because of reducing compatibility of the polyimides.

In the present invention, the polyimide (B) is necessary to be contained in the adhesive composition in an amount of 5–150 parts by weight based on 100 parts by weight of the first polyimide. Thus the adhesive composition becomes to be capable of bonding at a low temperature and to have sufficient reliability in the stages of wire bonding, molding, IR reflowing etc., because flowability at high temperature is controlled. If the amount of the polyimide (B) is less the 5 parts by weight, the adhesion temperature sometimes does not sufficiently reduce. If it is higher than 150 parts by weight, it becomes difficult to hold adhesive strength at high temperature.

The polyimide (B) is preferred to have a number molecular weight of 4,000–400,000 and particularly 8,000–200,000, which is similar to the polyimide (A).

The heat-resisting adhesive composition for electronic parts of the present invention may contain a silane coupling agent in an amount of not more than 15 parts by weight based on 100 parts by weight of the polyimide resin mixture.

If the amount is beyond 15 parts by weight, there are problems that the adhesive is too hard to result in reduction of the adhesion strength or the leadframe is contaminated upon taping or wire-bonding. A more preferable amount is in a range of from 0.1 to 5 parts by weight.

Examples of the silane coupling agent to be used include aminosilanes such as N-(2-aminoethyl)-3-aminopropylmethyldimethoxysilane, N-(2-aminoethyl)-3-aminopropyltrimethoxysilane, N-(2-aminoethyl)-3-aminopropylmethyldiethoxysilane, N-(2-aminoethyl)-3-aminopropyltriethoxysilane, 3-aminopropyltrimethoxysilane, 3-aminopropyltriethoxysilane, etc., epoxysilanes such as 3-glycidyloxypropyltrimethoxysilane, 3-glycidyloxypropyltriethoxysilane, 3-glycidyloxypropylmethyldimethoxysilane, 3-glycidyloxypropylmethyldiethoxysilane, etc., mercaptosilanes such as 3-mercaptopropyltrimethoxysilane, 3-mercaptopropyltriethoxysilane, etc., and vinylsilanes such as 3-methacryloxypropyltriethoxysilane, 3-methacryloxypropyltrimethoxysilane, vinyltrimethoxysilane, vinyltriethoxysilane, vinyl-tris(2-methoxyethoxy)silane, etc.

In the present invention, the above mentioned heat-resisting adhesive composition for electronic parts may contain a filler having a particle size of not more than 1 μm for the purpose of controlling characteristics during the adhering. The content of the filler when being incorporated is preferably from 0.1 to 50 parts by weight, and more preferably from 0.4 to 25 parts by weight, based on 100 parts by weight of the polyimide resin mixture. If the content of the filler exceeds 50 parts by weight, the adhesion strength is remarkably lowered. Conversely, if it is less than 0.1 parts by weight, no effect of the addition of the filler can be obtained. Examples of the filler which can be used are silica quarts powder, mica, alumina, diamond powder, zircon powder, calcium carbonate, magnesium oxide, fluorine containing resin, and the like.

The heat-resisting adhesive composition of the present invention may be used as a liquid adhesive composition (coating varnish) which can be obtained by adding an organic solvent, when the adhesive layer is formed by coating. Examples of the organic solvent used in the present invention include aprotic polar solvents, e.g., N-methyl-2-pyrrolidone, N,N-dimethylacetamide, N,N-dimethylformamide, dimethylsulfoxide, sulforane, hexamethylphosphoric acid triamide, and 1,3-dimethyl-2-imidazolidone, phenol solvents such as phenol, cresol, xylenol and p-chlorophenol, etc., isophorone, cyclohexanone, carbitol acetate, diglyme, dioxane, tetrahydrofuran, etc. Moreover, alcoholic solvents such as methanol, ethanol and isopropanol, ester solvents such as methyl acetate, ethyl acetate and butyl acetate, nitrile solvents such as acetonitrile and benzonitrile, aromatic solvents such as benzene, toluene and xylene, halogen solvents such as chloroform and dichloromethane, and the like can be mixed and used in such a degree that the polyimides are not separated. It is preferred to suitably control concentration and viscosity of the coating varnish depending to the application conditions.

The first adhesive tape for electronic parts of the present invention can be produced by laminating the adhesive composition comprising the above mentioned polyimides on a side or both sides of an electrically insulating heat-resisting film by means of a suitable method. For example, it is possible to use a method which comprises applying a liquid adhesive composition to a side of an electrically insulating heat-resisting film and drying to produce an adhesive tape having an adhesive layer on one side of the substrate, a method which comprises applying a liquid adhesive composition to a side of an electrically insulating heat-resisting film and drying, followed by applying the same adhesive composition to the other side of the heat-resisting film to produce an adhesive tape having an adhesive layer on both sides of the substrate, a method which comprises applying simultaneously a liquid adhesive composition to both sides of an electrically insulating heat-resisting film and drying to produce an adhesive tape having an adhesive layer on both sides of the substrate, and a method which comprises forming a single-layer film composed of the adhesive composition and laminating with a heat-resisting film with heat under pressure to produce an adhesive tape.

In the adhesive tape for electronic parts of the present invention, the whole thickness which can be suitably varied is generally in a range of 15–250 μm. The adhesive layer however is necessary to have a thickness of 5 μm at the lowest in order to assure the adhesion strength.

The heat resisting film which is the substrate is preferred to have an electrically insulating property. Examples of the heat resisting films include heat-resisting resin films such as those of polyimide, polyphenylene sulfide, polyether, polyparabanic acid, polyethylene terephthalate, etc., and compound heat-resisting films such as epoxy resin-glass cloth, epoxy resin-polyimide-glass cloth, etc. The heat resisting film to be used is preferred to have a thickness of 5–150 μm and particularly 10–75 μm.

In the above mentioned first adhesive tape for electronic parts, it is possible to provide a releasing film having thickness of 1–200 μm as a protective film on the adhesive layer. Typical examples of the releasing film used include resin films made of polyethylene, polypropylene, fluorine containing resin, polyethylene terephthalate, polyimide, etc. and paper, and those the surface of which is subjected to releasing treatment with a silicone releasing agent.

The second adhesive tape for electronic parts can be produced, for example, by applying the above-mentioned liquid adhesive composition to a releasing sheet and drying the adhesive layer. Moreover, it is possible to control the thickness of the adhesive layer by bonding the adhesive layers in a body. The adhesive tape can also be produced by known film forming processes. In general, the single-layer film which composes the second adhesive tape for electronic parts is preferred to have a thickness of 5–250 μm.

As be clear from the results of examination shown hereafter, the heat-resisting adhesive composition for electronic parts and the adhesive tape for electronic parts of the present invention have remarkably high reliability for adhesion of electronic parts, because of having excellent heat resistance and adhesive strength. Therefore, they can thus be suitably used as an adhesive tape for the innerlead fix of the leadframe and a TAB tape, etc. and can be used for adhering between parts around leadframes making up a semiconductor device, for example, lead pins, semiconductor-mounted substrate, heat spreader, and semiconductor chips themselves.

EXAMPLE

The present invention will now be described in greater detail. First, examples for producing polyimides and coating varnishes which are adhesive compositions using the polyimides are illustrated.

Synthetic Example 1

Into a flask equipped with a stirrer were introduced 23.08 g (67 mmol) of 1,3-bis[1-(4-aminophenyl)-1-methlethyl]

benzene, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride and 300 ml of N-methyl-2-pyrrolidone at an iced temperature, and the mixture was stirred for 1 hour. Subsequently, the resultant solution was reacted at room temperature for 3 hours to synthesize a polyamic acid. To the resulting polyamic acid were added 50 ml of toluene and 1.0 g of p-toluenesulfonic acid. The resultant mixture was heated to 160° C., and an imidation reaction was carried out for 3 hours while separating water which was flowed by being azeotropically distilled with toluene. After toluene was distilled off, the resulting polyimide varnish was poured in methanol, followed by separation of the resulting precipitate, pulverization, washing, and drying to obtain 62.5 g (yield: 98%) of a polyimide composed of the above mentioned repeating units in a proportion of (1a):(2a)=67:33.

The IR spectrum measurement of the resultant polyimide showed typical absorption bands of imide at 1718 cm$^{-1}$ and 1783 cm$^{-1}$. The number average molecular weight, glass transition temperature (Tg) and temperature of initiating thermal decomposition of the polyimide were determined. The results are shown in Table 1.

Synthetic Example 2

Using 27.50 g (67 vol) of 2,2-bis[4-(4-aminophenoxy)phenyl]propane, 8,20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride and 300 ml of N-methyl-2-pyrrolidone, a polyimide composed of the repeating units in a proportion of (1a):(2a)=67:33 was obtained in an amount of 65.0 g (yield: 96%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

Synthetic Example 3

Using 14.87 g (75 mmol) of 4,4'-diaminodiphenyl methane, 6.21 g (25 mmol) of 1,3-bis(3-aminopropyl)-1,1,3,3-tetramethyldisiloxane, 41.03 g (100 mmol) ethylene glycol bistrimellitate dianhydride and 300 ml of N-methyl-2-pyrrolidone, a polyimide composed of the repeating units in a proportion of (1b):(2b)=75:25 was obtained in an amount of 55.0 g (yield: 94%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

Synthetic Example 4

Using 21.92 g (75 mmol) of 1,3-bis(4-aminophenoxy)benzene, 6.21 g (25 mmol) of 1,3-bis(3-aminopropyl)-1,1,3,3-tetramethyldisiloxane, 41.03 g (100 mmol) ethylene glycol bistrimellitate dianhydride and 300 ml of N-methyl-2-pyrrolidone, a polyimide composed of the repeating units in a proportion of (1b):(2b)=75:25 was obtained in an amount of 64.0 g (yield: 97%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

Synthetic Example 5

Using 20.53 g (50 mmol) of 2,2-bis[4-(4-aminophenoxy)phenyl]propane, 12.43 g (50 mmol) of 1,3-bis(3-aminopropyl)-1,1,3,3-tetramethyldisiloxane, 35.83 g(100 mmol) of 3,3',4,4'-diphenylsulfonetetracarboxylic dianhydride and 300 ml of N-methyl-2-pyrrolidone, a polyimide composed of the repeating units in a proportion of (1a):(2a)=50:50 was obtained in an amount of 61.0 g (yield: 93%) by the same manner as in Synthetic Example 1. The IR spectrum measurement of the resultant polyimide showed typical absorption bands of imide at 1715 cm$^{-1}$ and 1786 cm$^{-1}$. The number average molecular weight, glass transition temperature and temperature of initiating thermal decomposition of the resultant polyimide were determined. The results are shown in Table 1.

Synthetic Example 6

Using 32.84 g (80 mmol) of 2,2-bis[4-(4-aminophenoxy)phenyl]propane, 4.97 g (20 mmol) of 1,3-bis(3-aminopropyl)-1,1,3,3-tetramethyldisiloxane, 35.83 g(100 mmol) of 3,3',4,4'-diphenylsulfonetetracarboxylic dianhydride and 300 ml of N-methyl-2-pyrrolidone, a polyimide composed of the repeating units in a proportion of (1a):(2a)=80:20 was obtained in an amount of 68.0 g (yield: 97%) by the same manner as in Synthetic Example 1. The IR spectrum measurement of the resultant polyimide showed typical absorption bands of imide at 1720 cm$^{-1}$ and 1783 cm$^{-1}$. The number average molecular weight, glass transition temperature and temperature of initiating thermal decomposition of the resultant polyimide were determined. The results are shown in Table 1.

Synthetic Example 7

Using 31.04 g (100 mmol) of 4,4'-diamino-3,3',5,5'-tetraethyldiphenylmethane, 35.83 g (100 mmol) of 3,3',4,4'-diphenylsulfonetetracarboxylic dianhydride and 300 ml of N-methyl-2-pyrrolidone, a polyimide composed of the repeating units in a proportion of (1a):(2a)=100:0 was obtained in an amount of 58.8 g (yield: 93%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

Synthetic Example 8

Using 15.52 g (50 mmol) of 4,4'-diamino-3,3',5,5'-tetraethyldiphenylmethane, 8.89 g (25 mmol) of 3,3',4,4'-diphenylsulfonetetracarboxylic dianhydride, 10.26 g (25 mmol) of ethylene glycol bistrimellitate dianhydride and 150 ml of N-methyl-2-pyrrolidone, a polyimide composed of the repeating units in a proportion of (1a):(1b)=50:50 was obtained in an amount of 29.6 g (yield: 92%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

Synthetic Example 9

Using 7.76 g (25 mmol) of 4,4'-diamino-3,3',5,5'-tetraethyldiphenylmethane, 6.21 g (25 mmol) of 1,3-bis(3-aminopropyl)-1,1,3,3-tetramethyldisiloxane, 17.91 g (50 mmol) of 3,3',4,4'-diphenylsulfonetetracarboxylic dianhydride and 150 ml of N-methyl-2-pyrrolidone, a polyimide composed of the repeating units in a proportion of (1a):(2a)=50:50 was obtained in an amount of 27.4 g (yield: 91%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

Synthetic Example 10

Using 11.64 g (37.5 mmol) of 4,4'-diamino-3,3',5,5'-tetraethyldiphenylmethane, 3.11 g (12.5 mmol) of 1,3-bis(3-aminopropyl)-1,1,3,3-tetramethyldisiloxane, 17.91 g (50 mmol) of 3,3',4,4'-diphenylsulfonetetracarboxylic dianhydride and 150 ml of N-methyl-2-pyrrolidone, a polyimide composed of the repeating units in a proportion of (1a):(2a)=75:25 was obtained in an amount of 29.6 g (yield: 92%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

Synthetic Example 11

Using 12.44 g (50 mmol) of 1,3-bis(3-aminopropyl)-1,1,3,3-tetramethyldisiloxane, 17.91 g (50 mmol) of 3,3',4,4'-diphenylsulfonetetracarboxylic dianhydride and 150 ml of N-methyl-2-pyrrolidone, a polyimide composed of the repeating units in a proportion of (1a):(2a)=0:100 was obtained in an amount of 25.7 g (yield: 90%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

Synthetic Example 12

Using 45.0 g (about 50 mmol) of α,ω-bis(3-aminopropyl) polydimethylsiloxane (functional group equivalent: 450, decamer: n=about 9 in the above-mentioned formula (4)), 17.91 g (50 mmol) of 3,3',4,4'-diphenylsulfonetetracarboxylic dianhydride and 150 ml of N-methyl-2-pyrrolidone, a polyimide composed of the repeating units in a proportion of (1a):(2a)=0:100 was obtained in an amount of 55.0 g (yield: 90%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

TABLE 1

| Synthetic Example | (1a):(1b):(2a):(2b) | Number average molecular weight | Glass transition temperature (° C.) | Temperature of initiating thermal decomposition (° C.) |
|---|---|---|---|---|
| 1 | 67:0:33:0 | 38000 | 160 | 450 |
| 2 | 67:0:33:0 | 26000 | 211 | 458 |
| 3 | 0:75:0:25 | 27000 | 140 | 455 |
| 4 | 0:75:0:25 | 15000 | 152 | 454 |
| 5 | 50:0:50:0 | 23000 | 180 | 451 |
| 6 | 80:0:20:0 | 48000 | 248 | 460 |
| 7 | 100:0:0:0 | 49000 | 282 | 446 |
| 8 | 50:50:0:0 | 89000 | 226 | 410 |
| 9 | 50:0:50:0 | 26000 | 186 | 458 |
| 10 | 75:0:25:0 | 69000 | 224 | 421 |
| 11 | 0:0:100:0 | 25000 | 150 | 403 |
| 12 | 0:0:100:0 | 26000 | 100 | 402 |

In the above Table 1, the measurement of the molecular weight of polyimides was carried out by GPC using tetrahydrofuran as an eluent and Shodex 80M X 2 as a column. Value of the molecular weight is a number average molecular weight which is calculated as polystyrene. The glass transition temperature (Tg) was determined by a differential thermal analysis (in a nitrogen atmosphere, heated at 10° C./min.) and the temperature of initiating thermal decomposition was determined by a thermogravimetry (in a nitrogen atmosphere, heated at 10° C./min.)

Example 1

100 g of polyimide produced in Synthetic Example 1 and 100 g of polyimide produced in Synthetic Example 11 were dissolved in 600 g of tetrahydrofuran to produce a heat-resisting liquid adhesive composition of the present invention. The resultant heat-resisting liquid adhesive composition was applied to a surface of a polyimide film having the thickness of 50 μm by a bar-coater so as to be a dried thickness of 25 μm, and dried in a hot air circulating oven at 150° C. for 5 minutes to form an adhesive layer. Then, the same liquid adhesive composition as described above was applied to the other side of the polyimide film and dried in a hot air circulating oven at 150° C. for 10 minutes to form an adhesive layer. Thus an adhesive tape having each an adhesive layer on both sides was produced, in which the total thickness of the adhesive layer was 100 μm.

Examples 2–16

Liquid adhesive compositions were prepared using polyimides produced in Synthetic Examples 2–10 or polyimides produced in Synthetic Examples 11 and 12 by the same manner as in Example 1. Using the resultant liquid adhesive compositions, adhesive tapes were produced by the same manner as in Example 1. In Examples 14–16, silane coupling agent was contained in an amount of 0.3% by weight in the adhesive composition. Silica filler having the particle size of 0.07 μm (produced by Arakawa Chemical Industries, Ltd.) was added in an amount of 10% by weight to the adhesive layers in Example 15 and alumina filler having the particle size of 0.05 μm (produced by Showa Denko K.K.) was added in an amount of 10% by weight to the adhesive layers in Example 16.

Example 17

100 g of polyimide produced in Synthetic Example 9 and 100 g of polyimide produced in Synthetic Example 11 were dissolved in 600 g of tetrahydrofuran to produce a heat-resisting liquid adhesive composition of the present invention. The resultant heat-resisting liquid adhesive composition was applied to a surface of a releasing polyethylene terephthalate film (thickness: 38 μm) so as to be a dried thickness of 25 μm, and dried in a hot air circulating oven at 150° C. for 10 minutes to produce a single-layer adhesive tape with a releasing film.

Example 18

A single-layer adhesive tape with a releasing film was produced by the same manner as in Example 17, except that 100 g of polyimide produced in Synthetic Example 10 and 100 g of of polyimide produced in Synthetic Example 11 were used for production of the adhesive composition.

Polyimides and mixing ratio thereof, silane coupling agent and the amount thereof, and filler and amount thereof (% by weight based on the total solid content) were shown in Table 2.

TABLE 2

| | Polyimide | | | | Silane couplings agent | |
|---|---|---|---|---|---|---|
| Example | Syn. Ex. | Syn Ex. | Proportion | Filler (wt. %) | Cmpound | Amount (g) |
| 1 | 1 | 11 | 100:100 | 0 | None | 0 |
| 2 | 2 | 11 | 100:120 | 0 | None | 0 |
| 3 | 3 | 11 | 100:70 | 0 | None | 0 |
| 4 | 4 | 11 | 100:100 | 0 | None | 0 |
| 5 | 5 | 11 | 100:100 | 0 | None | 0 |
| 6 | 6 | 11 | 100:100 | 0 | None | 0 |
| 7 | 7 | 11 | 100:150 | 0 | None | 0 |
| 8 | 8 | 11 | 100:100 | 0 | None | 0 |
| 9 | 9 | 11 | 100:100 | 0 | None | 0 |
| 10 | 10 | 11 | 100:100 | 0 | None | 0 |
| 11 | 7 | 12 | 100:100 | 0 | None | 0 |
| 12 | 9 | 12 | 100:50 | 0 | None | 0 |
| 13 | 3 | 12 | 100:10 | 0 | None | 0 |
| 14 | 9 | 11 | 100:100 | 0 | 3-Amino-propyl-triethoxysilane | 0.6 |
| 15 | 9 | 11 | 100:100 | 10 | do | 0.6 |
| 16 | 9 | 11 | 100:100 | 10 | do | 0.6 |
| 17 | 9 | 1i | 100:100 | 0 | None | 0 |
| 18 | 10 | 11 | 100:100 | 0 | None | 0 |

Comparative Examples 1–4

Using only the polyimide produced in Synthetic Example 3, Synthetic Example 9 or Synthetic Example 10, comparative adhesive tapes (Comparative Examples 1–3) were produced by the same manner as in Example 1. Similarly, a comparative adhesive tape (Comparative Example 4) was produced by the same manner as in Example 17 the polyimide produced in Synthetic Example 9. In order to evaluate the adhesive tapes obtained in the Examples and Comparative Examples and the adhesive compositions, the following operations was carried out.
(Assembling of Leadframe)
A leadframe used in a semiconductor package as shown in FIG. 2 was assembled according to the following procedures.
(a) Punching of Adhesive Tape
The adhesive tape was subjected to punch dying in a desired form by a mold.
(b) Assembling of Leadframe
The adhesive tape punched and a leadframe were positioned and heated under pressure (4 kgf/cm²/1 second in nitrogen atmosphere) on a hot plate to carry out assembling of the leadframe. The adhesion temperature in this stage was shown in Table 3.
(Examples of Using Liquid Adhesive Compositions)

Application Example 1

A liquid adhesive composition used in Example 3 was applied to a part of a semiconductor by a dispense so as to be a dried thickness of 20 μm, followed by drying in a hot air circulating oven at 150° C. for 10 minutes to form an adhesive layer on the part which was not the die pad area.

Application Example 2

A liquid adhesive composition used in Example 9 was applied to a part of a semiconductor by a dispense so as to be a dried thickness of 20 μm, followed by drying in a hot air circulating oven at 150° C. for 10 minutes to form an adhesive layer on the part which was not the die pad area.

Application Example 3 (Comparison)

A liquid adhesive composition was prepared using polyimide produced in Example 3. The resultant liquid adhesive composition was applied to a part of a semiconductor by a dispense so as to be a dried thickness of 20 μm, followed by drying in a hot air circulating oven at 150° C. for 10 minutes to form an adhesive layer on the part which was not the die pad area.
(Assembling of Semiconductor Package)
The semiconductor package was assembled according to the following operations.
(a) Die Bonding
In case of using the leadframes assembled as described above, a semiconductor chip was allowed to adhere to the leadframe at an adhesion temperature shown in Table 3 under conditions of 2 kgf/cm²/2 seconds in nitrogen atmosphere. In case of using the semiconductor chips having the adhesive layer formed according to the above Application Examples 1–3, a leadframe to which no adhesive tape was bonded was allowed to adhere to the semiconductor chip at an adhesion temperature shown in Table 3 under conditions of 2 kgf/cm²/2 seconds in nitrogen atmosphere.
(d) Wire Bonding
Using a wire bonder, a wire pad on the semiconductor chip and a silver plated portion at the end of the inner lead were connected with a gold wire.
(c) Molding
Using an epoxy molding compound, transfer molding was carried out.
(d) Finishing Stage
Via stages of forming, dum cutting, solder plating on the outer leads, etc., the packaging was finished.

TABLE 3

| Example | Adhesion temperature (° C.) | Comparative Example | Adhesion temperature (° C.) |
|---|---|---|---|
| 1 | 200 | 1 | 240 |
| 2 | 210 | 2 | 300 |
| 3 | 190 | 3 | 330 |
| 4 | 200 | 4 | 300 |
| 5 | 200 | Appl.Ex.3 | 230 |
| 6 | 220 | | |
| 7 | 200 | | |
| 8 | 220 | | |
| 9 | 200 | | |
| 10 | 220 | | |

TABLE 3-continued

| Example | Adhesion temperature (° C.) | Comparative Example | Adhesion temperature (° C.) |
|---|---|---|---|
| 11 | 190 | | |
| 12 | 210 | | |
| 13 | 190 | | |
| 14 | 210 | | |
| 15 | 210 | | |
| 16 | 210 | | |
| 17 | 200 | | |
| 18 | 200 | | |
| Appl.EX.1 | 180 | | |
| Appl.EX.2 | 190 | | |

(A) (The Results of Evaluations of Adhesive Tapes and Semiconductor Packages (n=10))

Adhesion Strength

An adhesive strength to lead pins was measured by pulling a lead pin of the leadframe by means of a push-pull gauge. In the case of using the adhesive tapes of Examples 1–18 and the adhesive composition using in Application Examples 1 and 2, the adhesive strength at room temperature was 35–45 g/10 mm at which the adhesive layer was broken. To the contrary, in the case of using the adhesive tapes of Comparative Examples 1–4 and the comparative adhesive composition using in Application Example 3, the adhesive strength at room temperature was 25–45 g/10 mm which meant large variations. In particularly, the adhesive tapes of Comparative Examples 1–3 were found to cause separation between the polyimide film and the adhesive layer. Then, a share adhesive strength of the chip was measured. As the result, all of the adhesive tapes of Examples 1–18, the adhesive tapes of Comparative Examples 1–4 and the adhesive compositions using in Application Examples 1–3 were found to have the strength of 1.2–2.3 kg. However, when the adhesive strength at 240° C. was measured, the adhesive tapes of Examples 1–18 and the adhesive compositions using in Application Example 1–2 showed 0.8–1.5 kg, while the adhesive tapes of Comparative Examples 1–4 and the comparative adhesive composition using in Application Example 3 caused a great reduction to show 0.1–0.4 kg.

(B) Embedding of Lead Pins

Embedding of Lead pins was evaluated by measuring a distance between the semiconductor chip and the leadframe after die bonding. As a result, in the case of using the adhesive tapes of Examples 1–18 and the adhesive compositions using in Application Example 1–2, the thickness of the adhesive layer changed within ±15%. To the contrary, in the case of using the adhesive tapes of Comparative Examples 1–4 and the comparative adhesive composition using in Application Example 3, the thickness of the adhesive layer changed ±40%, which meant poor accuracy of the thickness of the adhesive layer.

(C) Evaluation of Semiconductor Packages

The package obtained as described above were tested using the PCBT Test (Pressure Cooker Biased Test). This test was carried out at 5 volts of applied voltage at 121° C., at 2 atmospheres and at 100% relative humidity, in order to test electrical reliability. As the result, the adhesive tapes of Examples 1–18 and the adhesive compositions using in Application Example 1–2 did not cause shorting even after 1,000 hours. On the contrary, 3 samples caused interfacial separation between the polyimide film and the adhesive layer in case of the adhesive tape of Comparative Example 1–4 and the comparative adhesive composition using in Application Example 3, respectively, though no shorting occurred.

When the thermal cycle test was carried out at −50–160° C., no change was observed after lapse of 1000 cycles in case of the adhesive tapes of Examples 1–18 and the adhesive compositions using in Application Examples 1–2, but 8 samples caused interfacial separation between the polyimide film and the adhesive tape in case of the adhesive tapes of Comparative Examples 1–4 and the comparative adhesive composition using in Application Example 3.

As is clear from the results described above, the semiconductor packages can be produced in a good manner when the heat-resisting adhesive compositions according to the present invention are used in any state of the adhesive tape and liquid adhesive composition. In contrast, the adhesive tapes of Comparative Examples and the comparative adhesive composition are not suitable for manufacturing electronic parts because of causing troubles that the lead pins are embedded in the adhesive layer whereby the accuracy is not secured, interfacial separation is caused by the electrical reliability test, the adhesive strength varies in a wide range and, particularly, it remarkably reduces at a high temperature.

What is claimed is:

1. A heat resisting adhesive composition for electronic parts which comprises a resin mixture of (A) 100 parts by weight of a polyimide comprising 100–30% by mol of at least one of the repeating units represented by the following formulas (1a) and (1b) and 0–70% by mol of at least one of the repeating unit represented by the following formulas (2a) and (2b) and (B) 5–150 parts by weight of a polyimide consisting of the repeating unit represented by the following formula (2a):

(1a)

(1b)

wherein Ar represents a divalent group selected from the following formulas containing aromatic rings:

-continued wherein $R_1$, $R_2$, $R_3$ and $R_4$ which are identical or different represent each a hydrogen atom, an alkyl group having 1–4 carbon atoms or an alkoxy group having 1–4 carbon atoms, provided that $R_1$, $R_2$, $R_3$ and $R_4$ are not hydrogen atoms at the same time:

(2a)

(2b)

wherein R is an alkylene group having 1 to 10 carbon atoms or —$CH_2OC_6H_4$—, the methylene group of which attaches to Si, and n means an integer of 1 to 20.

2. The heat-resisting adhesive composition for electronic parts according to claim 1, wherein a silane coupling agent is added in an amount of 15 parts by weight or less based on 100 parts by weight of said resin mixture.

3. The heat-resisting adhesive composition for electronic parts according to claim 1, wherein a filler is added in an amount of 0.1–50 parts by weight based on 100 parts by weight of said resin mixture.

4. The heat-resisting adhesive composition for electronic parts according to claim 1, wherein said resin mixture is dissolved in an organic solvent.

5. An adhesive tape for electronic parts which comprises a heat-resisting film and an adhesive layer provided on a side or both sides of said heat-resisting film, wherein said adhesive layer is composed of a heat-resisting adhesive composition comprising a resin mixture of (A) 100 parts by weight of a polyimide comprising 100–30% by mol of at least one of the repeating units represented by the following formulas (1a) and (1b) and 0–70% by mol of at least one of the repeating unit represented by the following formulas (2a) and (2b) and (B) 5–150 parts by weight of a polyimide consisting of the repeating unit represented by the following formula (2a):

(1a)

(1b)

wherein Ar represents a divalent group selected from the following formulas containing aromatic rings:

-continued and wherein $R_1$, $R_2$, $R_3$ and $R_4$ which are identical or different represent each a hydrogen atom, an alkyl group having 1–4 carbon atoms or an alkoxy group having 1–4 carbon atoms, provided that $R_1$, $R_2$, $R_3$ and $R_4$ are not hydrogen atoms at the same time:

wherein R is an alkylene group having 1 to 10 carbon atoms or —$CH_2OC_6H_4$—, the methylene group of which attaches to Si, and n means an integer of 1 to 20.

6. The adhesive tape for electronic parts according to claim 5, wherein a releasing sheet is provided as a protective layer on said adhesive layer.

7. The adhesive tape for electronic parts according to claim 5, wherein a silane coupling agent is added to said adhesive layer in an amount of 15 parts by weight or less based on 100 parts by weight of said resin mixture.

8. The adhesive tape for electronic parts according to claim 5, wherein a filler is added to said adhesive layer in an amount of 0.1–50 parts by weight based on 100 parts by weight of said resin mixture.

9. An adhesive tape for electronic parts which comprises a single-layer adhesive film having a thickness of 5–250 μm composed of a heat-resisting adhesive composition comprising a resin mixture of (A) 100 parts by weight of a polyimide comprising 100–30% by mol of at least one of the repeating units represented by the following formulas (1a) and (1b) and 0–70% by mol of at least one of the repeating unit represented by the following formulas (2a) and (2b) and (B) 5–150 parts by weight of a polyimide consisting of the repeating unit represented by the following formula (2a):

(1a)

(1b)

wherein Ar represents a divalent group selected from the following formulas containing aromatic rings:

-continued wherein $R_1$, $R_2$, $R_3$ and $R_4$ which may be identical or different represent each a hydrogen atom, an alkyl group having 1–4 carbon atoms or an alkoxy group having 1–4 carbon atoms, provided that $R_1$, $R_2$, $R_3$ and $R_4$ are not hydrogen atoms at the same time:

(2a)

(2b)

wherein R is an alkylene group having 1 to 10 carbon atoms or —$CH_2OC_6H_4$—, the methylene group of which attaches to Si, and n means an integer of 1 to 20.

10. The adhesive tape for electronic parts according to claim 9, wherein a releasing sheet is provided as a protective layer on a side or both side of said single-layer adhesive film.

11. The adhesive tape for electronic parts according to claim 9, wherein a silane coupling agent is added to said single-layer adhesive film in an amount of 15 parts by weight or less based on 100 parts by weight of said resin mixture.

12. The adhesive tape for electronic parts according to claim 9, wherein a filler is added to said single-layer adhesive film in an amount of 0.1–50 parts by weight based on 100 parts by weight of said resin mixture.

* * * * *